United States Patent
Palara et al.

[11] Patent Number: 5,828,244
[45] Date of Patent: Oct. 27, 1998

[54] DRIVING CIRCUIT AND METHOD FOR DRIVING A MOS TRANSISTOR WITH DELAYED ACTIVATION

[75] Inventors: Sergio Palara, Acitrezza; Vito Graziano, Palermo, both of Italy

[73] Assignees: SGS-Thompson Microelectronics S.r.l., Agrate Brianza; Consorzio per la Ricerca sulla Microelettronica nel Mezzogiorno, Catania, both of Italy

[21] Appl. No.: 688,297

[22] Filed: Jul. 30, 1996

[30] Foreign Application Priority Data

Jul. 31, 1995 [EP] European Pat. Off. ............ 95830341

[51] Int. Cl.⁶ .................................................. H03K 3/00
[52] U.S. Cl. .......................... 327/108; 327/112; 327/428; 327/439
[58] Field of Search ................. 327/108–112, 374–377, 327/428, 434, 439

[56] References Cited

U.S. PATENT DOCUMENTS

| | | | |
|---|---|---|---|
| 3,742,252 | 6/1973 | Brzostek | 327/111 |
| 4,481,434 | 11/1984 | Janutka | 327/377 |
| 4,631,652 | 12/1986 | Wendt | 363/16 |
| 4,777,387 | 10/1988 | Collins | 327/109 |
| 5,126,651 | 6/1992 | Gauen | 323/222 |
| 5,352,932 | 10/1994 | Tihanyi | 327/108 |
| 5,371,418 | 12/1994 | Leipold et al. | 327/108 |

FOREIGN PATENT DOCUMENTS

A-0 486 359  5/1992  European Pat. Off. .
A-0 584 873  3/1994  European Pat. Off. .

*Primary Examiner*—Timothy P. Callahan
*Assistant Examiner*—Kenneth B. Wells
*Attorney, Agent, or Firm*—Wolf, Greenfield & Sacks, P.C.

[57] ABSTRACT

A driver circuit delays the turning on of a MOS transistor by utilizing the time-wise pattern of the circuit input signal rather than generating a delay within the circuit itself. A threshold type of circuit element is arranged so that no current flows toward or from, depending on the type of the MOS transistor, the control terminal before the voltage at the circuit input exceeds a predetermined value. This is achieved, for example, by coupling a Zener diode serially to the control terminal. Where the input signal is of a kind which increases with a degree of uniformity, the time required to exceed that threshold will correspond to the desired delay. Thus, the driver circuit can match the dynamic range of the input signal automatically.

36 Claims, 4 Drawing Sheets

DRIVING CIRCUIT AND METHOD FOR DRIVING A MOS TRANSISTOR WITH DELAYED ACTIVATION

BACKGROUND OF THE INVENTION

1. Field of the Invention

This invention relates to a driver circuit for use with MOS transistors, a MOS transistor provided with such a circuit, and applications of both.

2. Discussion of the Related Art

There are circuit arrangements having at least one transistor, typically a MOS power transistor, wherein a signal is available to control the transistor on and off, but the transistor turning on and off must be respectively delayed and advanced with respect to the times pre-arranged for the signal.

This requirement is common in the instance of self-oscillating bridge converters, for example, as used with driver arrangements for fluorescent lamps, such as that depicted in the accompanying FIG. 1.

The driver system of FIG. 1 is a traditional one having two input terminals AC1 and AC2 for a mains supply, e.g. at 220 Volts and 50 Hertz in many European countries, and 110 Volts and 60 Hertz in the United States, and comprises a bridge rectifier BR coupled to the terminals AC1 and AC2, filtering circuitry FT coupled to the output of the bridge BR for suppressing the AC component residue, and self-oscillating half-bridge circuitry for driving a fluorescent lamp LA which is coupled to the output terminals, VDD and GND, of the circuitry FT, with the terminal VDD functioning as a supply potential reference and the terminal GND as a ground potential reference. A fuse FS and/or a resistor RES may be connected between the terminals AC1 and AC2, on the one side, and the bridge BR on the other, for protection purposes.

The load on the half-bridge circuitry is comprised of a primary winding B3 of a transformer, an inductor L1, and the lamp LA, connected in series. A first terminal of this connection is coupled to the output of the half-bridge, and a second terminal is connected to the intermediate tap of a first capacitive divider; this first divider being connected between the terminal VDD and the terminal GND and comprising two capacitors, C3 and C4. Connected in parallel with the lamp LA is a second capacitive divider comprising two capacitors, C1 and C2. The intermediate tap of this second divider is connected, through a thermistor PTC coupled to the lamp LA, to the intermediate tap of a serial connection of two diodes, DP1 and DP2. The anode of the diode DP2 is connected to the terminal GND, the cathode of the diode DP2 to the anode of the diode DP1, and the cathode of the diode DP1 to the terminal VDD.

The half-bridge circuitry comprises a first power transistor M1 of the MOS type and a second power transistor M2, also of the MOS type, which have main conduction paths connected in series between the terminal VDD and the terminal GND. Each MOS power transistor has a driver circuit connected between its control and source terminals. The transistor M1 is coupled to a first driver circuit NT1 which has an input connected to a first secondary winding B1 of a transformer. The transistor M2 is coupled to a second driver circuit NT2, being identical with the circuit NT1, which has an input connected to a second secondary winding B2 of a transformer; the windings B1, B2, B3 belonging to the same transformer, and the windings B1 and B2 being substantially similar and connected to the respective driver circuits to supply them with voltages in phase opposition.

Associated with the half-bridge circuitry is start-up circuitry comprising a resistor RS and capacitor CS, connected in series between the terminals VDD and GND, a diode DS of the junction type which has its anode connected to the intermediate tap of that series connection and its cathode to the source terminal of the transistor M1, a diode DD of the DIAC type which has a first terminal connected to the intermediate tap of that series connection and a second terminal to the control terminal of the transistor M2, and a resistor RR connected in parallel with the main conduction path of the transistor M1. At system power-on, the control terminals of the transistors M1 and M2 are at zero potential and the capacitor CS begins to be charged. The diode DS will not be conducting because its cathode is at a very high potential due to the resistor RR provided. Upon the voltage across the capacitor CS exceeding the breakdown voltage of the diode DD, the transistor M2 begins to conduct and operation in the oscillating mode sets in.

A prior art driver circuit is illustrated by the accompanying FIG. 2 and comprises a resistor R0 which has a first terminal connected to a terminal G and a second terminal connected to a node A, a capacitor C0 which has a first terminal connected to a terminal S and a second terminal connected to the node A, a diode D0 which has its anode connected to the node A and its cathode connected to the control terminal of the MOS transistor (transistor M2 in FIG. 2) to be driven, and a bipolar transistor TR0 of the PNP type which has its emitter connected to the control terminal of the MOS transistor, its collector connected to the terminal S, and its base connected to the node A via a resistor RB; also provided is a diode D6 of the Zener type for protecting the MOS transistor against overvoltages. Also shown in FIG. 2 for completeness of illustration are the transistor M2, having its drain terminal connected to a terminal D and source terminal to the terminal S, and a diode DD, having a terminal connected to the control terminal of the transistor M2, although these parts do not belong, strictly speaking, to the driver circuit.

It matters that the two transistors are not turned on simultaneously to avoid the connection of the terminal VDD to the terminal GND which causes a huge flow of current through the two transistors M1 and M2—these transistors forming a conduction path of very low impedance—which is apt to inflict damage on them from overcurrent. Also important is to avoid, during normal operation when both transistors M1 and M2 are simultaneously off, too long a current re-circulation time through the re-circulating diodes, inherently present between the drain and the source terminals of MOS power transistors; dissipation through such diodes can be quite high, in fact.

The driver circuit of FIG. 2 is effective to turn on and off the MOS transistor connected to it at appropriate times; that is, the driver circuit of the transistor M1 should only turn it on after the driver circuit of the transistor M2 has turned it off, and vice versa. As is well recognized, the on and off states of the transistors M1 and M2 depend on the potential difference between the control and source terminals, and on their threshold voltage.

Delayed turn-on is provided by the phase shift introduced by the phase shifter consisting of the resistor R0 and the capacitor C0, although an accurate computation ought to also take account of the intrinsic capacitance which exists between the control and source terminals of the MOS transistor. The advanced turning-off is provided by turning on the transistor TR0, which would occur upon the voltage across the capacitor C0 dropping by some 1.4 Volts below its maximum value consequently to the capacitor being discharged through the resistor R0.

In a driver circuit as outlined above, the circuit components must be accurately sized to ensure utmost likeness in the performance of the various drivers, even with changing temperatures, for example. This likeness should be adequate to keep the duty cycle very close to fifty percent, and should prevent so-called "cross-conduction". In addition, the circuit is unsuitable for integration, particularly on account of the capacitor C0 therein.

In general, as well as in the converter of FIG. 1, the start-up condition is sensed by a suitable start up circuit directly connected to the power supply. At power-on, the start up circuit causes current to flow into the control terminal of one of the two MOS transistors and turn on the transistor, whereas in the steady state, the start up circuit has negligible or no effect.

Such start up circuits are usually selected to suit their intended application, require circuit elements with storage capabilities, usually capacitors, and are difficult to integrate to the MOS-type transistor, due both to design diversity of the circuits, the presence of the capacitors, and the inherent circuit spread-out.

SUMMARY OF THE INVENTION

It is an object of this invention to provide a driver circuit for MOS transistors which can obviate the drawbacks of prior art.

An embodiment of the invention is directed to a driver circuit for driving a MOS transistor having a control terminal and a source terminal, the driver circuit comprising a threshold circuit element having a first terminal that receives an input signal at a control input and a second terminal coupled to the control terminal of the MOS transistor, the threshold circuit delaying an activation of the MOS transistor by blocking current from flowing to the control terminal until a voltage of the input signal exceeds a predetermined value.

The driver circuit may further comprise a first turn off circuit having a first terminal coupled to the first terminal of the threshold circuit and a second terminal coupled to the control terminal, the first turn off circuit including a first junction that couples together the control terminal and the control input in response to the input signal. The first turn off circuit may further include a second junction coupled in series with the first junction and the control input. At least one of the first junction and second junction may disposed within a first junction transistor having a main conduction path that couples the control terminal to the source terminal.

The driver circuit may further comprise a second turn off circuit, including a second junction transistor, having a main conduction path that couples the control terminal to the source terminal, wherein the main conduction path of the first junction transistor controls the activation of said second junction transistor. The first junction transistor and the second junction transistor may be arranged to form a silicon controlled rectifier.

The invention further concerns a novel transistor of the MOS type comprising the driver function, a self-oscillating bridge converter, and a driver arrangement for glow lamps whereto this transistor can be advantageously applied.

BRIEF DESCRIPTION OF THE DRAWINGS

The invention can be better appreciated from the following description, when read in conjunction with the accompanying drawings, in which.

DETAILED DESCRIPTION

As pointed out in the introduction, the circuitry encompassed by a prior art self-oscillating bridge converter is fairly complex and hardly integratable.

An embodiment of this invention is directed to simplify that circuitry, specifically in the respect of the power devices which comprise the bridge. This has been achieved by providing a novel type of MOS transistor, such as that shown in FIG. 3, which is endowed with unique features. It should be understood, however, that this novel transistor type may be used wherever useful.

Figure 3:
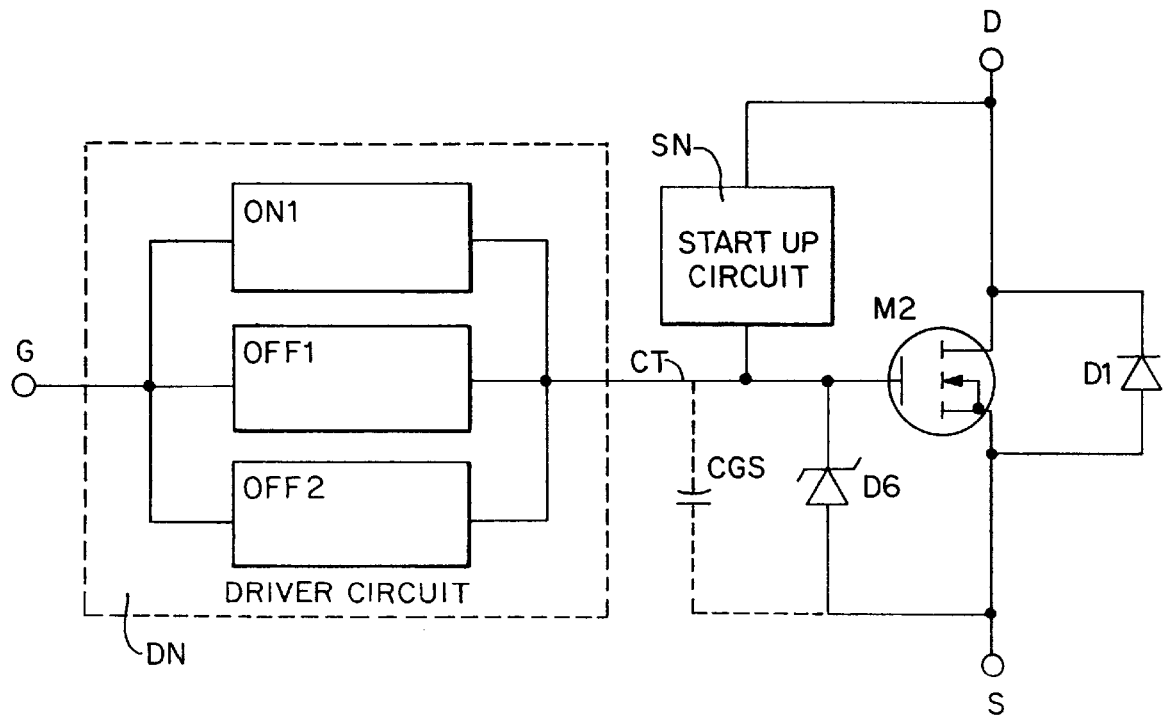
FIG. 3 is a combined block diagram of a driver circuit and a start up circuit according to an embodiment of this invention.

The transistor of FIG. 3 has three terminals only, as denoted by the characters G, S, D, and comprises a transistor M2 of the MOS type having a drain terminal connected to the terminal D, a source terminal connected to the terminal S, and a control terminal CT "coupled" to the terminal G.

In parallel with the main conduction path of the transistor M2, there is an intrinsic diode D1. This diode D1 functions to recirculate the current while the transistor M2 is in its off state, as is often the case with these inductive load applications. It is on this account that it has come to be known as the "re-circulating" diode. Advantageously connected between the control and source terminals of the transistor M2 is a diode D6 of the Zener type serving a transistor protection function, as is often done with these applications. Also shown is a capacitor CGS, in phantom lines to indicate that this capacitor is intrinsic to the transistor M2. In addition, two blocks are shown: the start up circuit SN and driver circuit DN.

The start up circuit SN couples the drain terminal of the transistor M2 to its control terminal.

The driver circuit DN couples the control terminal of the transistor M2 to the terminal G. As shown in FIG. 3, the circuit DN is comprised of three sub-circuits: a turn-on delay circuit ON1, a first turn-off circuit OFF1, and a second turn-off circuit OFF2.

What has been described in connection with the transistor M2 and FIG. 3 also applies to the transistor M1 and any other MOS transistor, including non-power and N- and P-channel ones.

The above sub-circuits will now be described in greater detail with reference to FIG. 4.

A principle on which an embodiment of the start up circuit of this invention operates is that of having the MOS transistor turned on by sensing local electrical quantities thereof, specifically the potential at the drain terminal of the MOS transistor.

The basic idea, in one embodiment of the invention, is one of injecting a small current into the control terminal when the drain terminal potential is high. For the purpose, an electric network is provided to couple both terminals together. In the embodiment of FIG. 4, the electric network comprises resistors R1, R2, R7 and diodes D4, D5.

It will be appreciated that the electric network may be embodied with varying degrees of complexity, using passive and/or active components. One embodiment includes a resistor with a suitable value.

Since for the specific application of driver arrangements to fluorescent lamps the drain terminal potential of MOS transistors is to attain very high values, e.g. in excess of 300 Volts, compared to the threshold voltage, which may be 2.5 Volts, a resistive divider may be used, which is simple and avoids excessively large current injections.

The divider may include a series coupling of resistors R7, R2 and R1, it being allowed to regard the series connection of the resistors R1 and R2 as a single resistor for the purposes of the start up circuit. A first end terminal, corresponding to a terminal of the resistor R7, is connected to the drain terminal of the MOS transistor. An intermediate tap, corresponding to a node included between the resistor R7 and the resistor R2, is coupled to the control terminal of the MOS transistor.

The second end terminal of the divider, corresponding to a terminal of the resistor R1, admits of at least two alternative connections.

A first possibility is to connect the second end terminal to the source terminal of the MOS transistor.

A second possibility is that of having the second end terminal connected to the terminal G, when the second terminal would function as the control terminal of the novel MOS transistor. In this case, the injected current would not only be dependent on the potential at the terminal D but also on the potential at the terminal G.

Figure 4:
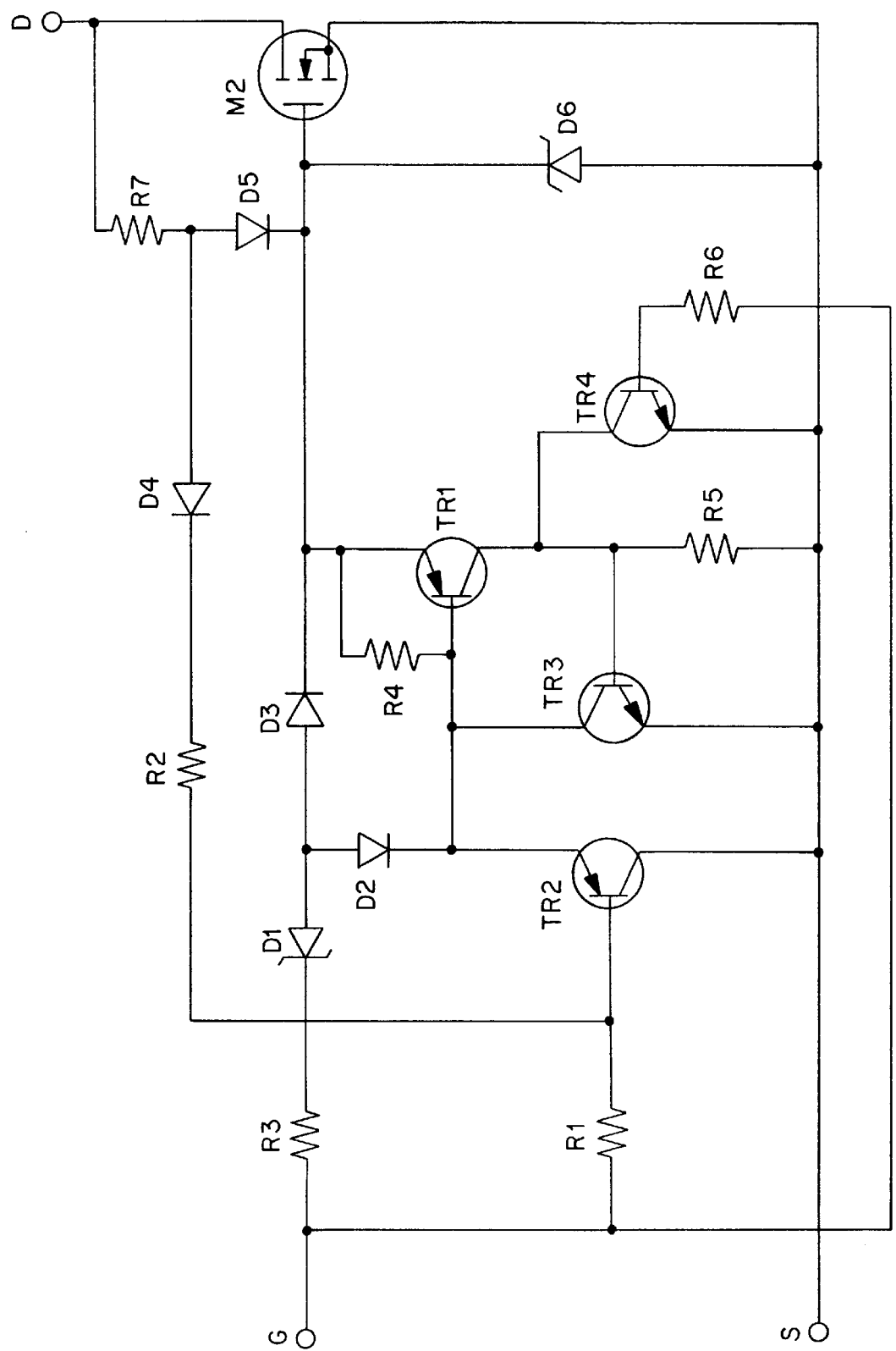
FIG. 4 is a combined circuit diagram of a driver circuit and a start up circuit according an embodiment of this invention.

Inserted in the circuit of FIG. 4 are unidirectional conduction circuit elements, in the form of diodes D4 and D5, which limit the steady state effects of the start up circuit SN. Thus, the divider may operate in the unidirectional mode only, this being a useful choice in itself as well as where the start up circuit is associated with a driver circuit, as is the case in FIG. 4.

The diode D5, connecting the control terminal of the MOS transistor—of the N-channel type in FIG. 4—to the intermediate tap of the divider, is effective to prevent the control terminal of the transistor from being discharged at a time when this is undesired.

The diode D4, connecting the resistors R7 and R2, functions to make unidirectional the flow of current from the drain terminal of the MOS transistor.

A first principle on which the driver circuit of this invention operates is to cause the turning on of the MOS transistor to be delayed by utilizing the time-wise pattern of the circuit input signal, rather than generating a delay within the circuit itself.

The basic idea is one of using a threshold type of circuit element and arranging for no current flow toward or from— according to the type of MOS transistor—the control terminal, until the circuit input voltage exceeds a predetermined value. This can be achieved, for example, by coupling a Zener diode D1 in series to the control terminal, as in the embodiment of FIG. 4. Where the input signal is of a kind which increases with a degree of uniformity, the time required to exceed that threshold will correspond to the desired amount of delay. In this way, the driver circuit can be matched to the dynamic range of the input signal automatically.

A second principle on which the driver circuit of this invention operates is to have the MOS transistor turned off by using a different conduction path from the turn-on path.

The basic idea is to cause at least one junction, coupled between the circuit input and the control terminal, to be turned on. The circuit of FIG. 4 uses two junctions, coupled serially together, which correspond to the transistors TR1 and TR2.

Where this junction belongs to a bipolar transistor, such as the transistor TR1 in FIG. 4, it can be of advantage if its main conduction path couples the control terminal and source terminal together. In this way, the MOS transistor would be turned off rapidly through a low-impedance conduction path and while seeing a very low fixed potential, i.e. the ground potential. The turn-off speed is also tied to the gain of the bipolar transistor TR1.

The above junctions belong to the first turn-off circuit OFF1, since their conduction is activated directly by changes in potential at the input of the driver circuit.

Advantageously, the second turn-off circuit OFF2 can be inserted in the driver circuit for faster turning off, its conduction being activated by the first turn-off circuit OFF1.

The second circuit OFF2 includes a third transistor, such as the transistor TR3 in FIG. 4, which has a main conduction path coupling the control and source terminals together and is controlled to the on state by a first bipolar transistor of the first circuit OFF1, such as the transistor TR1 in FIG. 4, through its main conduction path. In this way, the MOS transistor can be rapidly turned off while seeing a very low fixed potential, i.e. the ground potential, through a conduction path having a very low impedance if the third transistor is brought to a state of deep conduction by the first transistor.

When the first and third transistors are connected to form an SCR device, as shown in FIG. 4, the turn-off effect that results from its firing will not be limited by the time-wise pattern of the circuit input signal, and is practically instantaneous.

In further detail and with reference to FIG. 4, the driver circuit is comprised of the following.

The terminal G is connected to a first terminal of a resistor R3 which has a second terminal connected to the cathode of the Zener diode D1. The anode of the diode D1 is connected to the anode of a junction diode D3 having its cathode connected to the control terminal of the transistor M2. The combination of these elements provides an embodiment of the circuit ON1.

The anode of the diode D1 is also connected to the anode of a junction diode D2 having its cathode connected to the emitter of the PNP-type transistor TR2 whose collector is connected to the terminal S and whose base is connected to the resistor R1. The transistor TR1, of the PNP type, has its emitter connected to the control terminal of the transistor M2, its collector connected to the terminal S via a resistor R5, and its base connected to the emitter of the transistor TR2. A resistor R4 is connected across the emitter and base terminals of the transistor TR1. The combination of these elements provides an embodiment of the circuit OFF1.

The transistor TR3, of the NPN type, has its emitter connected to the terminal S, its collector connected to the base of the transistor TR1, and its base connected to the collector of the transistor TR1. The combination of these elements provides an embodiment of the circuit OFF2.

A transistor TR4 of the NPN type is also provided which has its collector connected to the collector of the transistor TR1, its emitter connected to the terminal S, and its base connected to the terminal G via a resistor R6. All this, in combination with the diodes D2 and D3, is effective to prevent the SCR device from being turned on when this is not desired.

With the driver and start up circuits (DN, SN) associated together in the circuit of FIG. 4, account may be taken of their mutual influence in selecting the parameters for the circuit elements as well as in certain topology options. For example, the resistive value of the resistor R2 may be selected such that, upon turning on, the transistors TR1 and TR2 will not enter conduction, or the resistive divider of the start up circuit may have, additionally to an intermediate tap for the control terminal of the MOS transistor, another intermediate tap corresponding to a node included between the resistor R1 and the resistor R2 for driving the transistor TR2.

Advantageously, circuitry like that just described can be integrated on a single chip and inserted into a package provided with but three terminals, G, S and D.

A transistor such as that described above can be used to advantage in a self-oscillating bridge converter, whether of the full or half-bridge type, specifically of a near-resonant type. A converter such as this has several applications, including driver arrangements for fluorescent lamps.

A transistor of the kind described above may also be used to advantage in a generic driver arrangement for fluorescent lamps.

Figure 5:
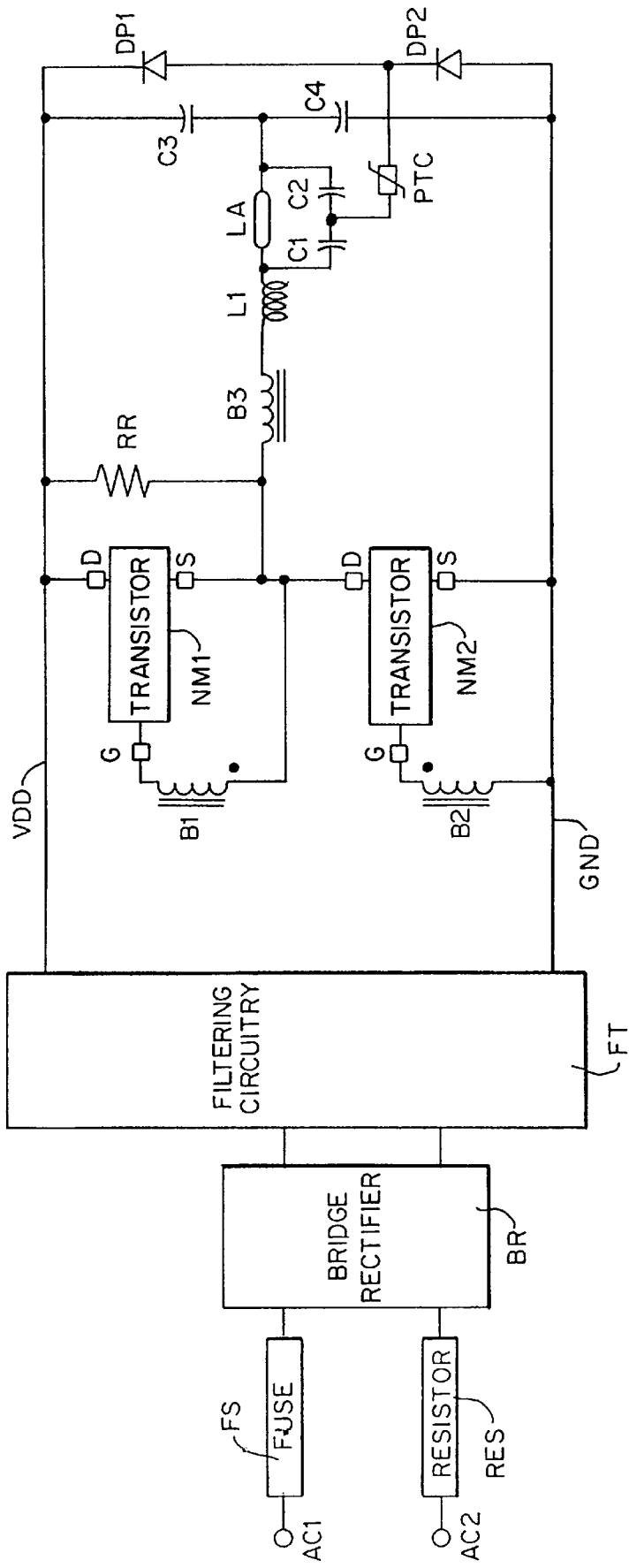
FIG. 5 illustrates a driver arrangement for fluorescent lamps which includes a self-oscillating bridge converter, both of which are in accordance with an embodiment of this invention.

Shown in FIG. 5 is a driver arrangement for fluorescent lamps which comprises a self-oscillating bridge converter, both being in accordance with an embodiment of this invention.

Figure 1:
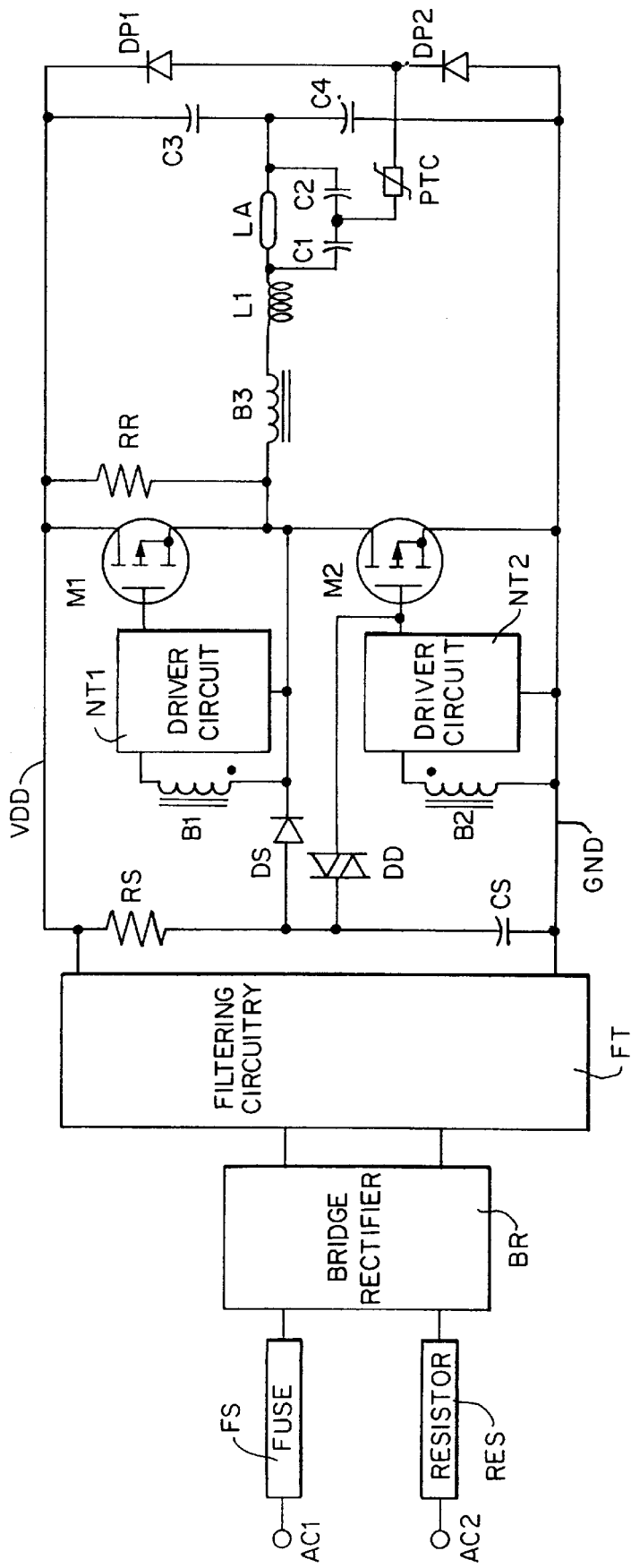
FIG. 1 illustrates a driver arrangement for fluorescent lamps which includes a self-oscillating bridge converter, both of which are conventional.
Figure 2:
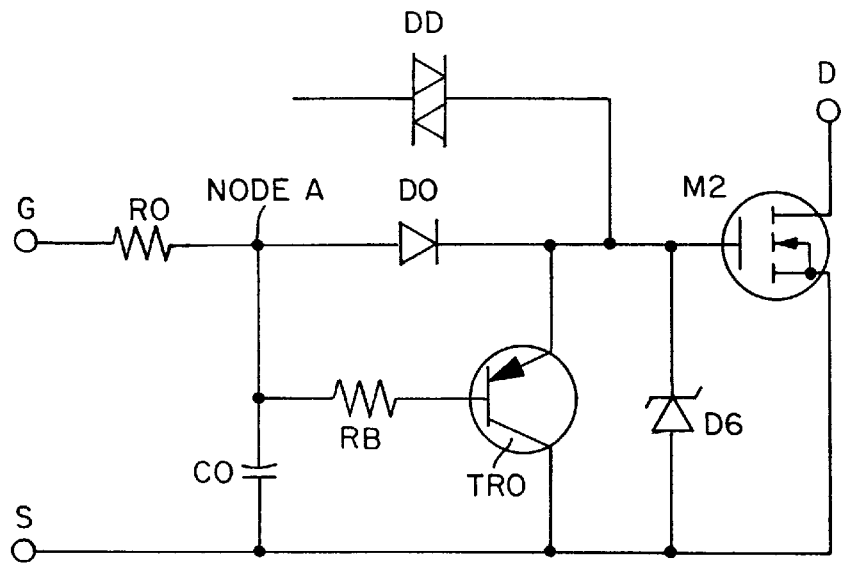
FIG. 2 is a circuit diagram of a conventional driver circuit usable with the converter of FIG. 1.

The arrangement in FIG. 5 is similar to the arrangement in FIG. 1, but comprises a half-bridge composed of a first transistor NM1 and a second transistor NM2, both in accordance with this invention. The terminal D of the transistor NM1 is connected to the terminal VDD, the terminal S of the transistor NM1 is connected to the terminal D of the transistor NM2, and the terminal S of the transistor NM2 is connected to the terminal GND. The secondary windings B1 and B2 are connected across the terminals G and S of the transistors NM1 and NM2, respectively.

Also provided is a resistor RR which is connected across the terminals D and S of the transistor NM1. This resistor allows the output potential of the half-bridge to be set at the system power-on. This potential will be fairly high, e.g. not far below the potential at the terminal VDD.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only, and not intended to be limiting. The invention is limited only as defined in the following claims and the equivalents thereto.

What is claimed is:

1. A driver circuit for driving a MOS transistor having a control terminal and a source terminal, the driver circuit comprising:
   a threshold circuit element having a first terminal that receives an input signal at a control input and a second terminal coupled to the control terminal, the threshold circuit element delaying an activation of the MOS transistor by blocking current from flowing to the control terminal until a voltage of the input signal exceeds a predetermined value;
   a first turn off circuit having a first terminal coupled to the first terminal of the threshold circuit and a second terminal coupled to the control terminal, including:
      a first junction that couples together the control terminal and the control input in response to the input signal; and
      a second junction between the control terminal coupled in series with the first junction and the control input; and a second turn off circuit having a first terminal coupled between the first junction and the second junction and a second terminal connected to the source terminal.

2. The driver circuit of claim 1, wherein the first junction is disposed within a first junction transistor having a main conduction path that couples the control terminal to the source terminal.

3. The driver circuit of claim 2, wherein the second turn off circuit includes a second junction transistor, having a main conduction path that couples the control terminal to the source terminal, wherein the main conduction path of the first junction transistor controls the activation of the second junction transistor.

4. The driver circuit of claim 3, wherein the first junction transistor and the second junction transistor are arranged to form a silicon controlled rectifier.

5. The driver circuit of claim 1, in combination with the MOS transistor.

6. The driver circuit of claim 5, further comprising a passive electrical startup network that couples a drain terminal of the MOS transistor to the control terminal.

7. The driver circuit of claim 7, wherein the MOS transistor and driver circuit are made in an integrated form on a single chip having an external gate terminal, an external source terminal, and an external drain terminal.

8. The driver circuit of claim 1, in combination with the MOS transistor that further includes a drain terminal, a second MOS transistor having a source terminal, a control terminal, and a drain terminal, wherein:
   the drain terminal of the MOS transistor receives a first power signal;
   the drain terminal of the second MOS transistor receives a second power signal;
   the source terminal of the MOS transistor is coupled to the source terminal of the second MOS transistor; and
   the control terminal of the MOS transistor is coupled to the control terminal of the second MOS transistor, to form a self-oscillating bridge converter.

9. The driver circuit of claim 1, in combination with the MOS transistor and a fluorescent lamp, wherein a drain terminal of the MOS transistor receives an input power signal and the source terminal of the MOS transistor provides controlled power to the fluorescent lamp.

10. The driver circuit of claim 1, wherein the first turn off circuit includes a silicon controlled rectifier.

11. A method for controlling a MOS transistor, comprising the steps of:
   receiving a first input signal for activating the MOS transistor;
   delaying the first input signal for a delay period;
   activating the MOS transistor subsequent to the delay period;
   receiving a second input signal for deactivating the MOS transistor;
   deactivating the MOS transistor without waiting the delay period, the step of deactivating the MOS transistor including:
      coupling a gate terminal of the MOS transistor to the second input signal, the step of coupling including activating a first junction and a second junction, the first junction and the second junction being connected in series between the gate terminal of the MOS transistor and the second input signal; and activating a third junction, the third junction having a first terminal connected between the first junction and the second junction and a second terminal connected to a source terminal of the MOS transistor.

12. The method of claim 11, wherein the step of delaying includes waiting until a voltage of the input signal is greater than a predetermined value.

13. The method of claim 11, wherein:
the step of delaying includes blocking the input signal until a voltage of the input signal reaches a predetermined value with respect to a voltage of the gate terminal of the MOS transistor; and
the step of activating the MOS transistor includes conducting the input signal to the gate terminal subsequent to the delay period.

14. The method of claim 11, wherein the step of deactivating includes conducting the input signal for deactivating the MOS transistor to the gate terminal of the MOS transistor.

15. The method of claim 11, wherein the step of deactivating includes coupling the gate terminal of the MOS transistor to the source terminal of the MOS transistor.

16. The method of claim 15, wherein the step of coupling includes coupling the gate terminal of the MOS transistor to the source terminal of the MOS transistor until substantially no current flows from the gate terminal to the source terminal of the MOS transistor.

17. An apparatus for controlling a MOS transistor, the apparatus comprising:
means for receiving a first input signal for activating the MOS transistor;
means for delaying the first input signal for a delay period;
means for activating the MOS transistor subsequent to the delay period;
means for receiving a second input signal for deactivating the MOS transistor;
means for deactivating the MOS transistor without waiting the delay period, the means for deactivating including:
a first turn off circuit having a first terminal coupled to a gate terminal of the MOS transistor and a second terminal coupled to the means for receiving, including:
a first junction electrically coupling the means for receiving with the gate terminal when a deactivation signal is received at the means for receiving; and
a second junction coupled in series with the first junction between the gate terminal of the MOS transistor and the means for receiving; and
a second turn off circuit having a first terminal coupled between the first junction and the second junction and a second terminal connected to a source terminal of the MOS transistor.

18. The apparatus of claim 17, wherein the means for delaying includes means for waiting until a voltage of the input signal is greater than a predetermined value.

19. The apparatus of claim 17, wherein:
the means for delaying includes means for blocking the input signal until a voltage of the input signal reaches a predetermined value with respect to a voltage of the gate terminal of the MOS transistor; and
the means for activating includes means for conducting the input signal to the gate terminal subsequent to the delay period.

20. The apparatus of claim 17, wherein the means for deactivating includes means for conducting the input signal for deactivating the MOS transistor to the gate terminal of the MOS transistor.

21. The apparatus of claim 17, wherein the means for deactivating includes means for coupling the gate terminal of the MOS transistor to the source terminal of the MOS transistor.

22. The apparatus of claim 21, wherein the means for coupling includes means for coupling the gate terminal of the MOS transistor to the source terminal of the MOS transistor until substantially no current flows from the gate terminal to the source terminal of the MOS transistor.

23. The apparatus of claim 21, wherein the means for receiving, the means for delaying, and the means for activating are integrated on a single piece of silicon.

24. A circuit for controlling a MOS transistor having a gate terminal, the circuit comprising:
a turn on circuit having a first terminal coupled to the gate terminal and a second terminal coupled to an input terminal, the turn on circuit delaying an activation signal received at the input terminal and providing a delayed signal to the gate terminal to activate the MOS transistor;
a first turn off circuit having a first terminal coupled to the gate terminal and a second terminal coupled to the input terminal, including:
a first junction electrically coupling the input terminal with the gate terminal when a deactivation signal is received at the input terminal; and
a second junction coupled in series with the first junction between the gate terminal of the MOS transistor and the input terminal; and
a second turn off circuit having a first terminal coupled between the first junction and the second junction and a second terminal connected to a source terminal of the MOS transistor.

25. The circuit of claim 24, wherein the turn on circuit includes a zener diode having an anode coupled to the first terminal of the turn on circuit and a cathode coupled to the second terminal of the turn on circuit.

26. The circuit of claim 21, wherein the turn on circuit includes a delay circuit that delays the activation signal until the activation signal has a voltage that is greater than a predetermined voltage.

27. The circuit of claim 24, wherein the first junction is included in a first transistor coupled between the gate terminal and the input terminal, the first transistor coupling the gate terminal to the input terminal when the deactivation signal is received.

28. The circuit of claim 27, wherein the second junction is included in a second transistor coupled between the first transistor and the input terminal, the second transistor coupling the first transistor to the input terminal when the deactivation signal is received.

29. The circuit of claim 24, wherein the second turn off circuit comprises a first terminal coupled to the gate terminal and a second terminal coupled to the source terminal of the MOS transistor, the second turn off circuit electrically coupling the gate terminal with the source terminal when the deactivation signal is received at the input terminal.

30. The circuit of claim 29, wherein the second turn off circuit includes a device having a first terminal coupled to the gate terminal, a second terminal coupled to the source terminal, and an input terminal responsive to the deactivation signal, the device conducting current from the first terminal of the second turn off circuit to the second terminal of the second turn off circuit once the input terminal receives the deactivation signal, until substantially no current flows from the first terminal to the second terminal.

31. The circuit of claim 30, wherein the the first turn off circuit is coupled to the second turn off circuit, the first turn off circuit activating the second turn off circuit when the deactivation signal is received.

32. The circuit of claim 29, in combination with the MOS transistor.

33. The circuit of claim 32, wherein the MOS transistor and the circuit for controlling the MOS transistor are made in an integrated form on a single chip having an external gate terminal, an external source terminal, and an external drain terminal.

34. The circuit of claim 32, further comprising a passive electrical startup network that couples a drain terminal of the MOS transistor to the gate terminal when a voltage at the drain terminal exceeds a predetermined voltage.

35. The circuit of claim 24, in combination with the MOS transistor that further includes a source terminal and a drain terminal, and with a second MOS transistor having a source terminal, a gate terminal, and a drain terminal, wherein:

the drain terminal of the MOS transistor receives a first power signal;

the drain terminal of the second MOS transistor receives a second power signal;

the source terminal of the MOS transistor is coupled to the source terminal of the second MOS transistor; and the gate terminal of the MOS transistor is coupled to the gate terminal of the second MOS transistor, to form a self-oscillating bridge converter.

36. The circuit of claim 24, in combination with the MOS transistor and a fluorescent lamp, wherein a drain terminal of the MOS transistor receives an input power signal and the source terminal of the MOS transistor provides controlled power to the fluorescent lamp.

* * * * *